(12) United States Patent
Rengarajan et al.

(10) Patent No.: US 6,323,103 B1
(45) Date of Patent: Nov. 27, 2001

(54) METHOD FOR FABRICATING TRANSISTORS

(75) Inventors: Rajesh Rengarajan, Poughkeepsie; Jochen Beintner, Wappingers Falls; Ulrike Gruening, Wappingers Falls; Hans-Oliver Joachim, Wappingers Falls, all of NY (US)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/175,267

(22) Filed: Oct. 20, 1998

(51) Int. Cl.⁷ .................................. H01L 21/8238

(52) U.S. Cl. ..................... 438/424; 438/199; 438/224

(58) Field of Search ..................... 438/424, 142, 438/197, 199, 221–224, FOR 227, FOR 187, FOR 217; 216/11; 257/344

(56) References Cited

U.S. PATENT DOCUMENTS

| | | |
|---|---|---|
| 3,892,609 | 7/1975 | Coppen . |
| 4,151,635 | 5/1979 | Kashkooli et al. . |
| 4,411,058 | 10/1983 | Chen . |
| 4,599,789 | 7/1986 | Gasner . |
| 4,939,154 | 7/1990 | Shimbo . |
| 5,382,532 | 1/1995 | Kobayashi et al. . |
| 5,866,465 | * 2/1999 | Doan et al. . |
| 5,874,317 | * 2/1999 | Stolmeijer . |
| 5,989,792 | * 8/1998 | Tsutsumi . |
| 6,033,958 | * 6/1998 | Chou et al. . |

FOREIGN PATENT DOCUMENTS 0 996 151 A3    4/2000   (EP) .

OTHER PUBLICATIONS

IBM Technical Disclosure Bulletin, vol.35, No.4B, Sep. 1992, Twin–Well Sub–0.25um CMOS with Ultra–Shallow Junction Fabricated Using a Selection Epitaxial Technique, pp. 16–18.*

IBM Technical Disclosure Bulletin, vol. 35, No. 4B, Dated Sep. 1992, entitled Twin–Well Sub–0.25um CMOS with Ultra–Shallow Junction Fabricated Using a Selective Epitaxial Technique, pp. 16–18.

(List continued on next page.)

*Primary Examiner*—George Fourson
*Assistant Examiner*—Thanh V Pham

(57) ABSTRACT

A method is provided for fabricating a first and second MOSFET transistors in different electrically isolated active areas of a semiconductor body, each one of the transistors having a plurality of layers. A first gate oxide layer and a first poly-crystalline silicon layer are deposited over the semiconductor body over the active areas. Trenches are etched in said first gate oxide and poly-crystalline silicon layers and said semiconductor body to delineate the first and second active areas, thereby forming first delineated gate oxide layer and poly-crystalline silicon layers coextensive with the first active area. Material is deposited in said trenches to form the active area isolations, the active area isolations having a top surface above said semiconductor body. A masking layer is then formed over said first and second active areas and selective portions of it are removed to expose said second active area. The masking layer and the active area isolations together form a mask defining an opening coextensive with the second active area with the active area isolations defining said opening. Material through the opening to form a second gate oxide layer and a second poly-crystalline layer, such second layer and second poly-crystalline layer being coextensive with the second active area. The first transistor with the first delineated gate oxide and poly-crystalline layer as a pair of the plurality of layers of the first transistor and the second transistor with the second gate oxide layer and second poly-crystalline layer as a pair of the plurality of layers of the second transistor.

41 Claims, 11 Drawing Sheets

OTHER PUBLICATIONS

Publication entitled 1/4–UM CMOS Isolation Technique Using Selectiv Epitaxy From I.E.E.E. Transactions on Electron Devices, Ed–34 (1987) Jun., No. 6, pp. 1331–1336.

Patent Abstract of Japan, Pub. No. 59019347, Dated Jan. 31, 1984, Applicant Matsushita Electric Ind. Co., Ltd. Entitled Semiconductor Integrated Circuit and Manufacture Thereof.

* cited by examiner

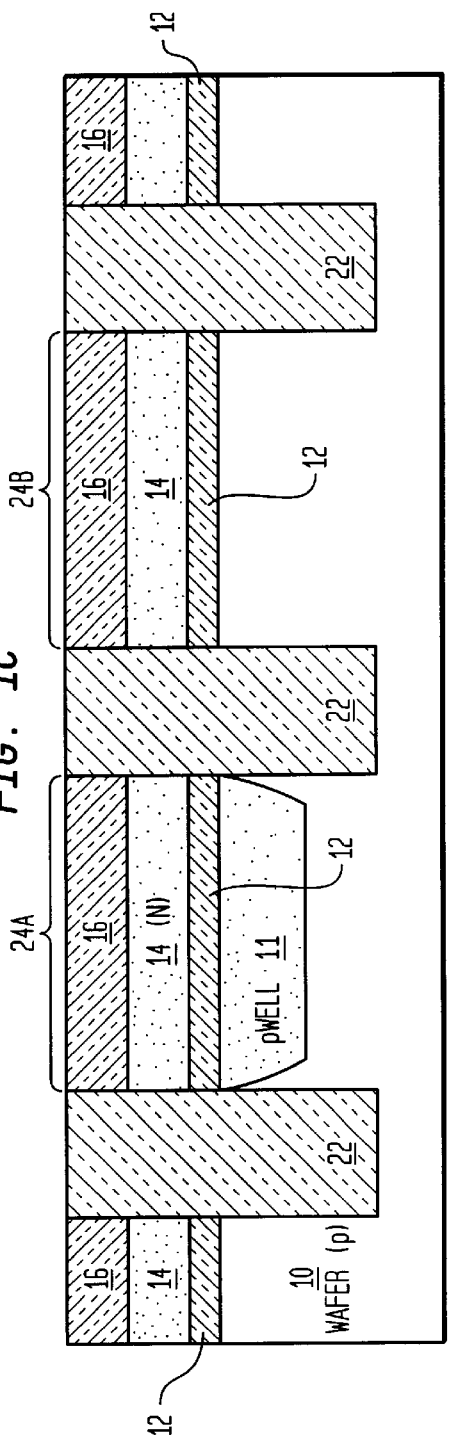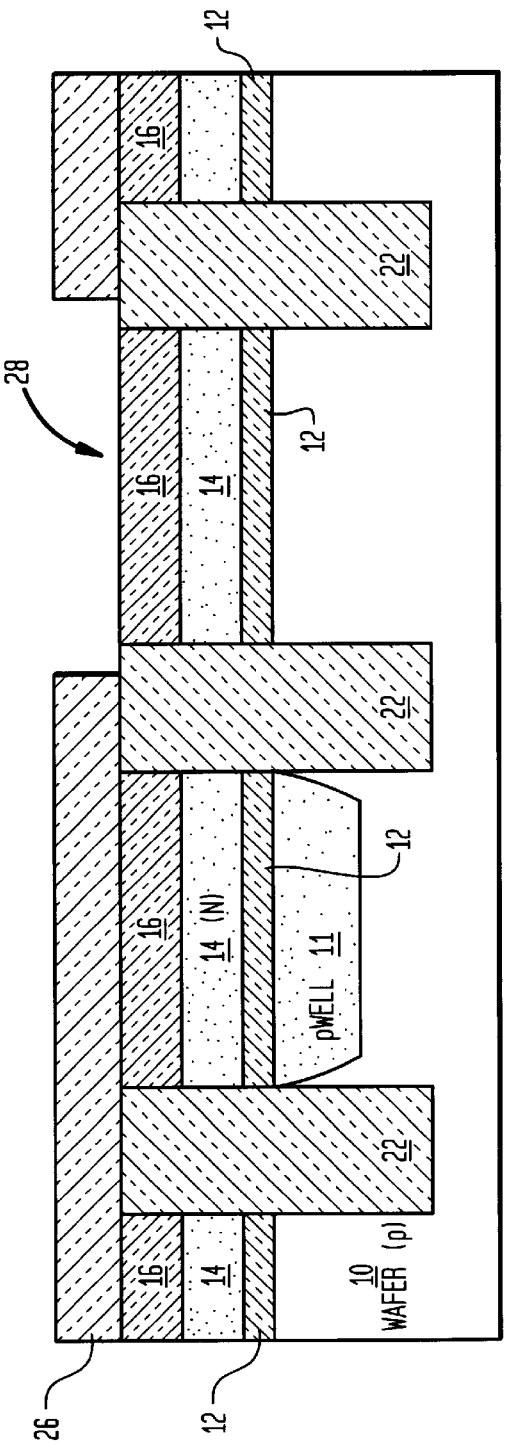

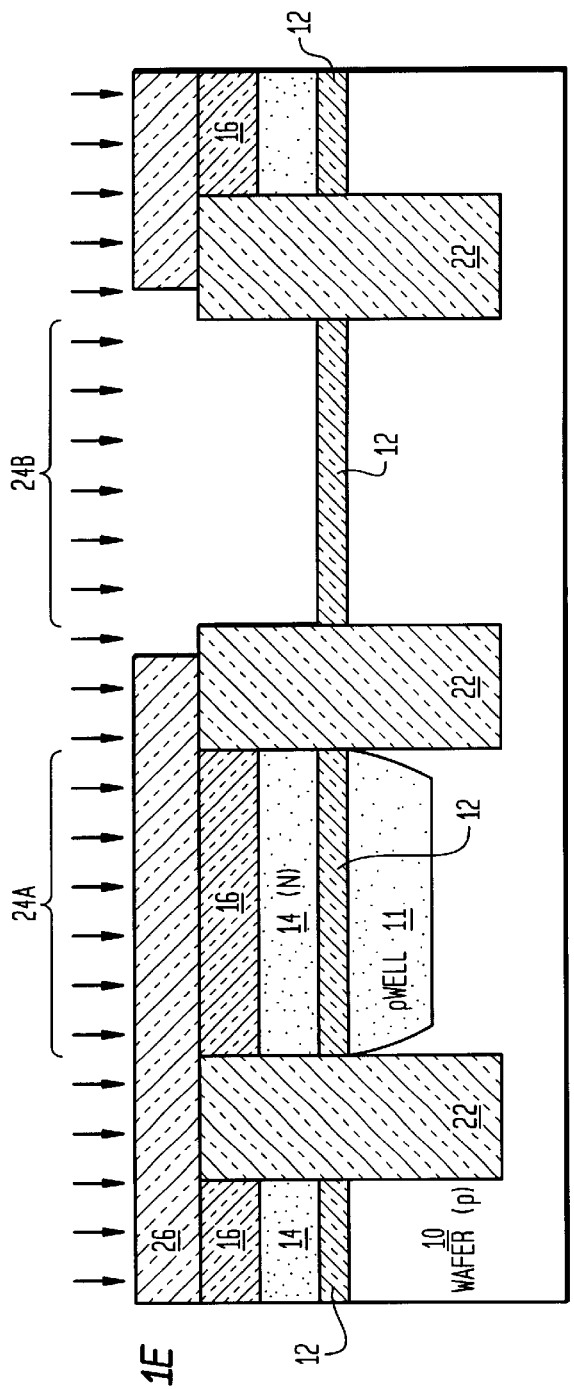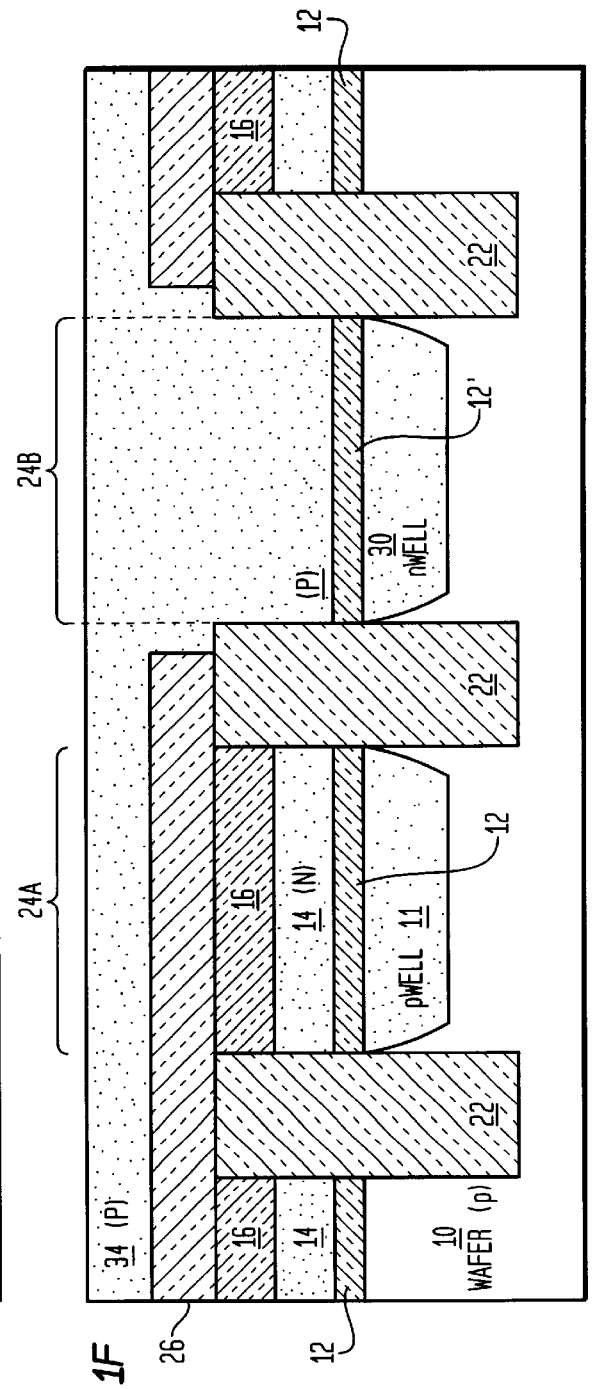

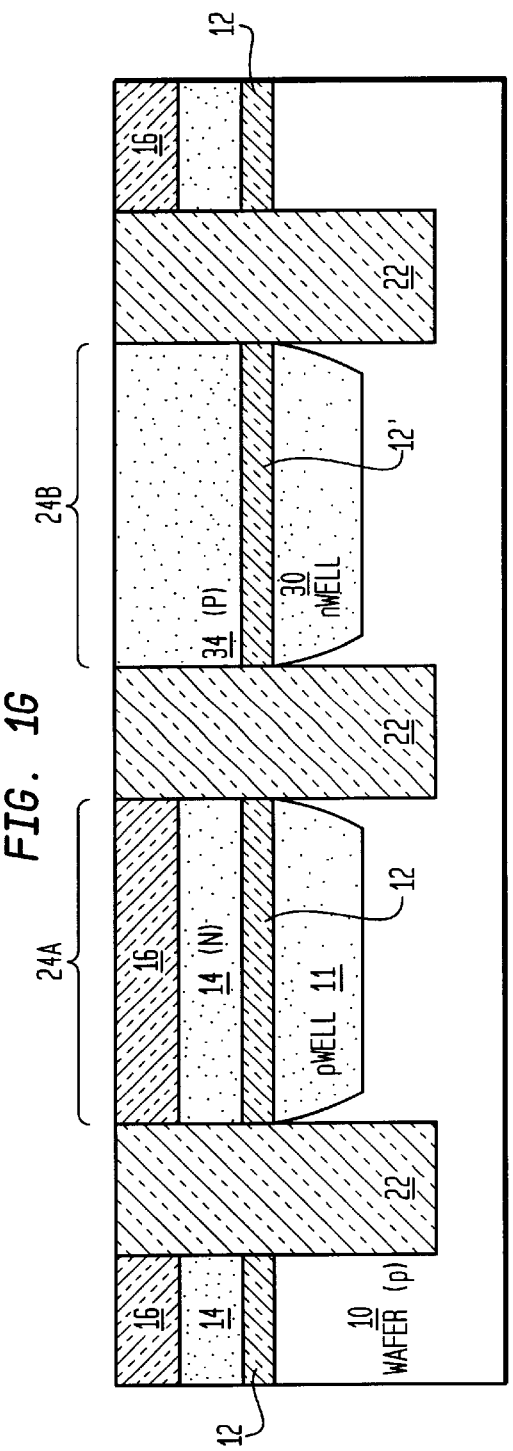
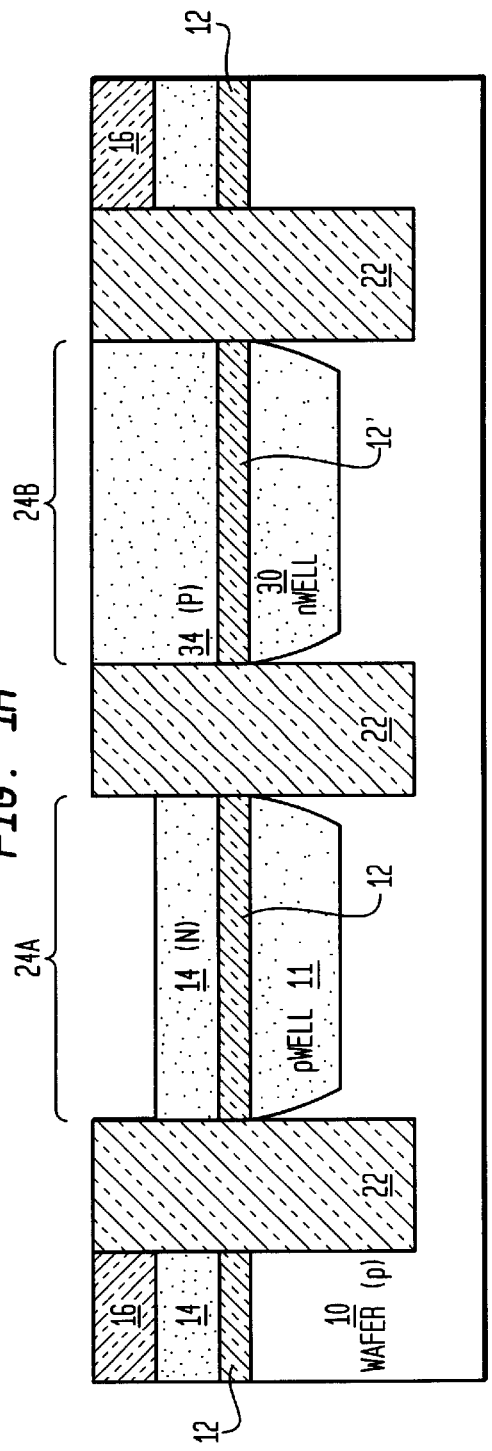

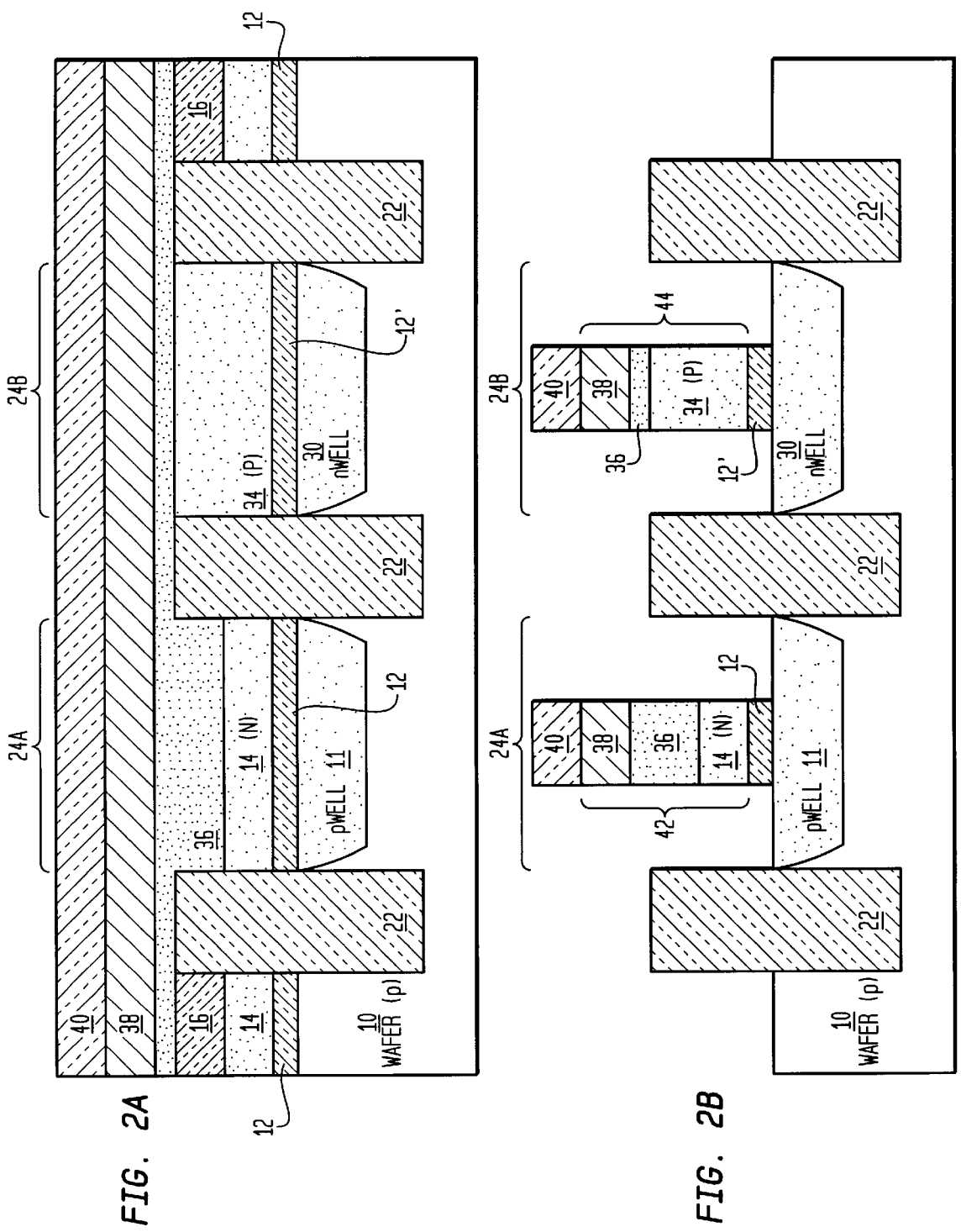

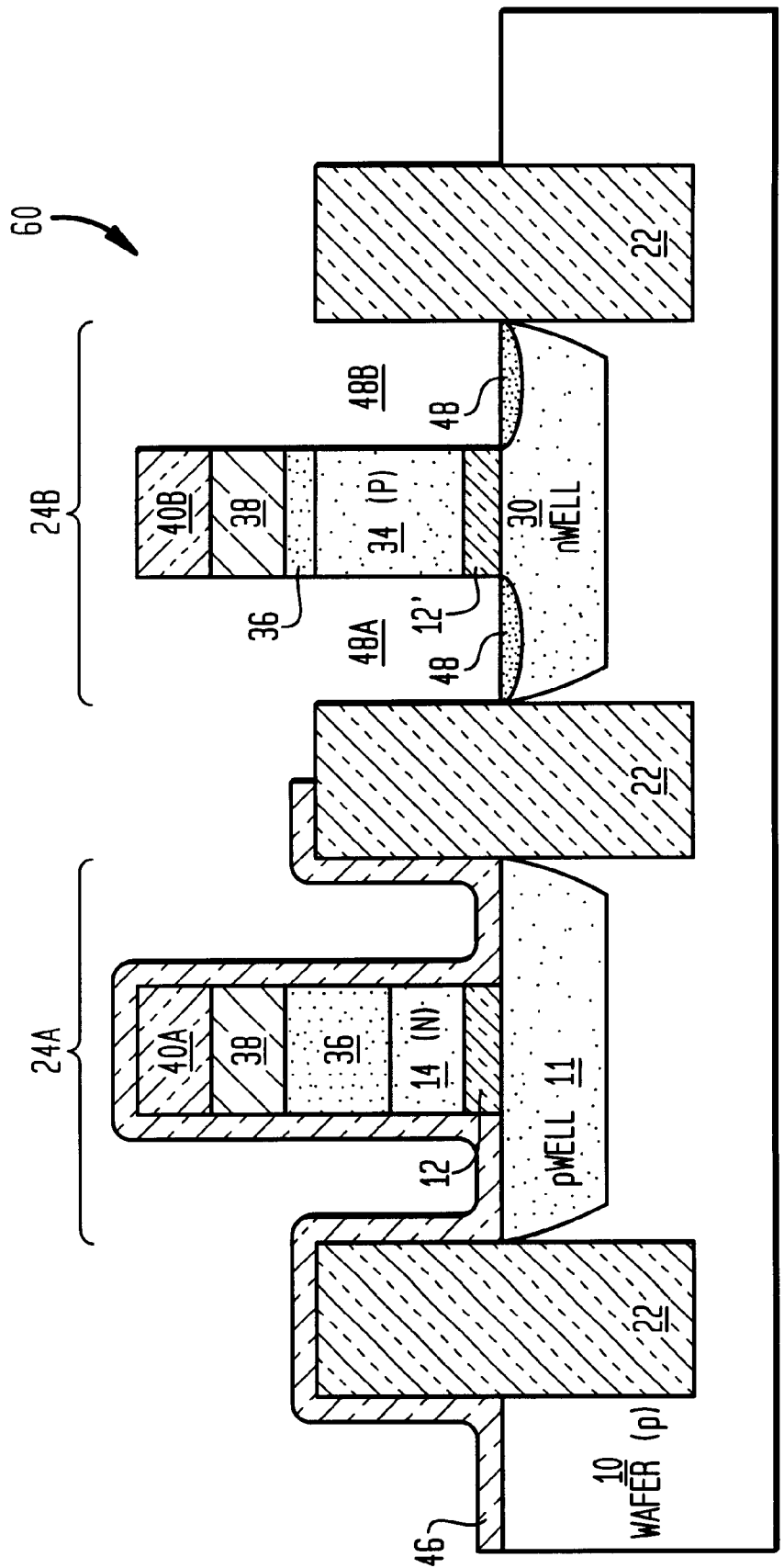

METHOD FOR FABRICATING TRANSISTORS

BACKGROUND

This invention relates to methods for fabricating transistors, namely complementary metal-oxide field effect transistors (CMOS FETS).

The cost and yield of a fabricating process for fabricating semiconductor chips depends on various factors. One factor is the number of masks (or masking layers) which are used during the process. An increase in the number of masks used in a process generally increases the cost of the process. Another factor is the extent to which the process uses self-aligned processing steps or misalignment tolerant structures. Misalignment tolerant structures are structures which, when being fabricated, have a high degree of tolerance to being misaligned with previously formed or subsequently formed structures. As is obvious, self-aligned steps or misalignment tolerant structures increase the yield of the fabricating process by reducing the number of chips which are inoperative due to misalignment. Therefore, it is generally preferable to reduce the number of masks and to increase the number of self-aligned steps and misalignment tolerant structures used in a manufacturing process. However, these two objectives must also be balanced against one another and against the features desired in a process.

Consider an exemplary DRAM memory chip. In such a DRAM memory chip, various types of logic circuits provide various functions. For example, address decoders decode address lines and access DRAM cells in a memory array, clock generators generate and process various clock signals, and refresher circuits refresh the DRAM cells in the memory array. Unlike the DRAM cells in the memory array which are implemented by a single type of metal oxide semiconductor field effect transistor (MOSFET or FET), the logic circuits in such a DRAM memory chip are typically implemented by complementary MOS FETs (CMOS FETs), which include both n-type and p-type FETs (n-FET or p-FET, respectively).

One desirable feature in a CMOS circuit is for the circuit to be a dual work function circuit. In such a circuit, the gate electrode of the n-FET transistors and the p-FET transistors are fabricated differently from one another so that they may be optimized for low work function. Since a transistor with lesser work function uses a lower voltage level than one with a higher work function, the former transistor uses lower power and may be fabricated to have smaller dimensions and faster switching speeds.

To understand such a dual work function circuit, consider an n-FET or p-FET transistor. As is well known, the gate electrode of such a transistor is made up of at least a gate oxide and a gate conductor. The gate conductor is typically a doped poly-crystalline silicon (also known as polysilicon) layer. If the gate poly-crystalline silicon layer of an n-FET or p-FET is doped with the opposite type of dopant as the channel region below the gate electrode, the work function of the gate is less than when the gate poly-crystalline silicon layer is doped with the same type of dopant. However, the channel region of a CMOS transistor may be either n-doped or p-doped silicon based on whether the CMOS transistor is a p-FET or n-FET. Therefore, to provide for optimal work function in a CMOS circuit, the gate poly-crystalline silicon layer of n-FETs should be n-doped while the gate poly-crystalline silicon layer of p-FETs should be p-doped. Such a CMOS circuit then provides for dual-work functions.

Another desirable feature in integrated circuits is the ability to use so-called "border-less" contacts, since borderless contacts have a higher degree of misalignment tolerance and allow an increased number of transistors per unit of area. Borderless contacts also reduce the possibility of a short circuit between the contact and the gate electrode. To form borderless contacts, the gate electrode is covered, in its relevant parts, by dielectric barriers. The dielectric barriers are typically a dielectric cap on the top surface of the gate electrode and dielectric spacers on the sides of the gate electrode where the contact is to be formed. Because these dielectric barriers insulate the gate electrode, there is a low probability of misalignments causing short circuits between the contact and the gate electrode.

SUMMARY

In accordance with one feature of the invention, the invention features a method for fabricating first and second MOSFET transistors in different electrically isolated active areas of a semiconductor body. Each one of the transistors has a plurality of layers. A first layer is formed over the active areas. A mask is then provided over the first active area, such mask defining an opening coextensive with the second active area. Material is deposited through the opening to form a second layer and a third layer, such second and third layers being coextensive with the second active area. The first transistor is formed with the first layer as one of the plurality of layers of such first transistor and the second transistor is formed with the second layer and third layer as a pair of the plurality of layers of the second transistor.

Accordingly, a single mask may be used to deposit at least two layers to become part of the second transistor. Therefore, in some embodiments where, for example, it is necessary to remove the gate oxide and/or gate control layer in an active area and to form a new gate oxide or gate control layer, the same mask may be used to implant a doped well as one layer and deposit the gate oxide and/or gate control layers as another layer.

In accordance with another feature of the invention, the first layer is formed in both the first and second active areas and then removed in whole or in part the first layer from the second active area. The first layer may be a first gate oxide layer. A first poly-crystalline silicon layer may also be deposited, the first poly-crystalline silicon layer being one of the plurality of layers of the first transistor. In that case, the mask covers the first poly-crystalline silicon layer. The second layer may be a second gate oxide layer and the third layer a second poly-crystalline silicon layer. One of the first and second poly-crystalline silicon layers may be an n-doped poly-crystalline silicon layer and the other one of the first and second poly-crystalline silicon layers a p-doped poly-crystalline silicon layer. The first gate oxide layer and the second gate oxide layer in turn may have different thicknesses.

In accordance with still another feature of the invention, the semiconductor body has a first type of dopant and the material includes a second type of dopant forming a doped well in the semiconductor body, the second layer being the doped well.

In accordance with another feature of the invention, trenches are etched in the first gate oxide and poly-crystalline silicon layers, and also in the semiconductor body, to delineate the first and second active areas. A first delineated gate oxide and poly-crystalline silicon layers coextensive with the first active area are thereby formed. Material is then deposited in the trenches to form the active area isolations, the active area isolations having a top surface above the semiconductor body. Active area isolations define the second active area and electrically isolate the second active area. A masking layer over the first and second active areas is formed and selective portions of it are removed to expose the second active area. The active area isolations are part of the mask and in part or in whole define the opening.

In accordance with another feature of the invention, material is deposited to form a fourth layer over the mask covering the first active area and in the second active area, selected portions of the fourth layer are then removed to form one of the second and third layers. Portions of the fourth layer are removed by using a chemical mechanical polish (CMP) process to etch the fourth layer until the fourth layer is at the same level or below the top surface of the active area isolations.

In accordance with yet another feature of the invention, the second transistor is formed by etching and patterning the second gate oxide and the second poly-crystalline silicon layer to form a gate electrode, the gate electrode and the active area isolation regions defining source and drain areas in the second active area for forming source and drain regions of the second transistor. A second masking layer is formed over the first and second active area. Selective portions of the masking layer are removed to expose the second active area, where the masking layer and the active area isolations together form a mask defining the opening coextensive with the second active area. The active area isolations in whole or in part define the opening. Dopant material is then implanted through the opening in the source and drain areas to form the source and drain regions of the second transistor in the semiconductor body. The source and drain regions of the second transistor are thereby self-aligned with the active area isolations and the second gate electrode. The first transistor is formed in a similar manner.

In accordance with still another feature of the invention, a dielectric layer is deposited over the second poly-crystalline silicon layer. Therefore, when etching and patterning the second gate oxide layer and the second poly-crystalline silicon layer to form the second gate electrode, the dielectric layer is etched and patterned to form a dielectric cap over the second poly-crystalline silicon layer in the second gate electrode. Therefore, in some embodiments, for example, it is desirable to remove the first poly-crystalline and/or gate oxide layers in the second active area and to replace it with a second poly-crystalline silicon and/or gate oxide layers. Therefore, here, instead of removing a dielectric cap in the second active area in order to remove the first poly-crystalline and/or gate oxide layers, the dielectric layer is not formed until after the second gate control and/or gate oxide layers are deposited. Additionally, because the dielectric cap is then formed when the gate oxide and poly-crystalline silicon layers are etched and patterned to form the gate electrode, the dielectric cap is self-aligned with the gate electrode.

In accordance with another feature of the invention, a dielectric spacer adjacent to a side of the second gate electrode is formed. The dielectric spacer extends from the dielectric cap to one of the source and drain regions adjacent to that side of the second gate electrode. A conductive contact is then formed to the one of the source and drain regions, the conductive contact being electrically isolated from the second gate electrode by the dielectric cap and the dielectric spacer.

In accordance with yet another feature of the invention, at least a portion of the mask covering the first active area is removed prior to depositing the dielectric layer and the dielectric layer is deposited over the first poly-crystalline silicon layer in the first active area. As with the dielectric cap in the second active area, the dielectric layer is etched and patterned to form a second dielectric cap over the first poly-crystalline silicon layer in the first gate electrode, when etching and patterning the first gate oxide and the first poly-crystalline silicon layer to form the first gate electrode. In the same manner as forming the source and drain regions of the second transistor, forming the first transistor further then includes providing a third mask for forming source and drain regions of the first transistor in the semiconductor body and implanting material in the semiconductor body through the third mask to form the source and drain regions of the first transistor.

In accordance with yet another aspect of the inventions, a dielectric spacer is formed adjacent to a side of the first gate electrode. The dielectric spacer extends from the second dielectric cap to one of the source and drain regions of the first transistor being adjacent to the side of the first gate electrode. A conductive contact to the one of the source and drain regions of the first transistor is then formed. The conductive contact being isolated from the first gate electrode by the second dielectric cap and the dielectric spacer.

Other features and advantages of the invention will become apparent from the following description of preferred embodiments, including the drawings, and from the claims.

BRIEF DESCRIPTION OF THE DRAWING

FIGS. 1A–1H are diagrammatical cross-sectional views of a semiconductor device at various stages of an embodiment of the fabrication process of the device according to the invention, where the semiconductor device includes dual work function CMOS transistors.

FIG. 1B' is a diagrammatical cross-sectional view of a semiconductor device at a stage of an embodiment of the fabrication process for the device according to the invention, where the semiconductor device includes dual work function CMOS transistors.

FIGS. 2A–2F are diagrammatical cross-sectional views of a semiconductor device at various stages of an embodiment of the fabrication process of the device according to the invention, where the semiconductor device includes dual work function CMOS transistors having borderless contacts.

FIG. 2C' is a diagrammatical cross-sectional view of a semiconductor device at a stage of an embodiment of the fabrication process of the device according to the invention, where the semiconductor device includes dual work function CMOS transistors having borderless contacts.

DESCRIPTION

We will describe in detail below an embodiment of a fabrication process for fabricating transistors; however, briefly, according to some embodiments, two MOSFET transistors such as CMOS transistors are fabricated. A first active area for the first transistor and a second active area for the second transistor are delineated by, for example, forming active area isolations in the substrate. The first active area includes a first delineated layer of material coextensive with the first active area. To form the first delineated layer of material, a first layer of material may, for example, be formed prior to forming the active area isolations and the process of forming the active area isolations may then delineate the first layer of material. The first layer of material may be a gate oxide and a doped poly-crystalline silicon layer.

A masking layer is then formed over the first and second active areas and selective portions of the masking layer are removed to expose the second active area. A second and third delineated layer of material coextensive with the second active area is then formed in the second active area by using the active area isolations and/or the masking layer to delineate the second delineated layer of material. The second and third delineated layers of material may include a gate oxide and a doped poly-crystalline silicon layer. This second and third layers of material preferably different characteristic from corresponding layers in the first active area which will form part of the layers of the first transistor. For example, the poly-crystalline silicon layer in the second layer of material may be differently doped, the gate oxide in the second layer of material may have a different gate oxide thickness, or the second layer of material may include a doped well implant. Using the first and second delineated layers of material, the first and second transistors may then be formed.

In some embodiments, a dielectric layer may also be formed in the first active area, the second active area, or both, prior to pattering and etching the first and second layers of material to form the gate electrodes. When the first and second layers of material are etched and patterned to form the gate electrodes, the dielectric layer is also etched and patterned to form a dielectric cap for the gate electrodes. After forming the dielectric cap, source and drain regions are formed, followed by dielectric spacers adjacent to at least those portions of the gate electrodes where borderless contacts are to be formed. The transistors, having a dielectric cap and spacers insulating the gate electrode, are then ready for borderless contacts to be formed.

Figure 1A:
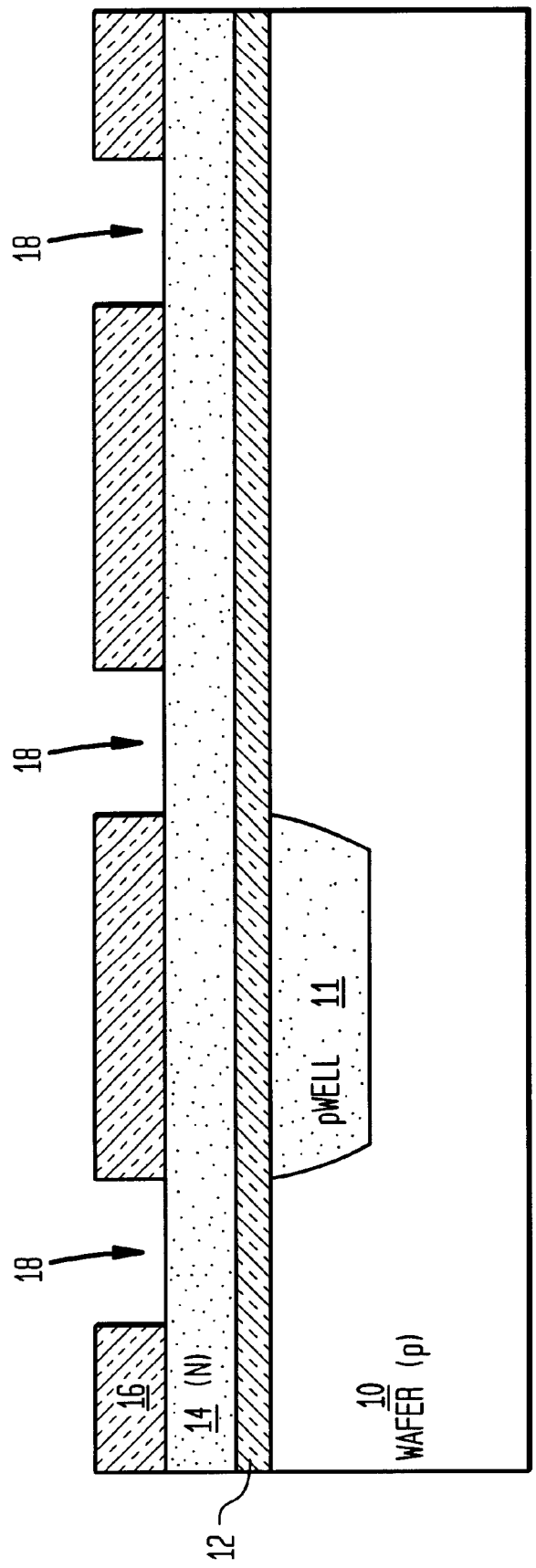

We will now describe in detail an embodiment of the fabrication process for MOSFET transistors. FIG. 1A diagrammatically illustrates a semiconductor substrate 10, here an undoped silicon wafer, in which a p-doped well (p-well) 11 has been formed. Over semiconductor substrate, a gate oxide layer 12 and an n-doped poly-crystalline silicon layer 14 have been formed. Gate oxide layer 12 is, for example, a thermally grown silicon dioxide ($SiO2$) layer, having a thickness of approximately 30–100 Angstroms preferably about 50 Angstroms. Poly-crystalline silicon layer 14 is, for example, deposited by chemical vapor deposition techniques to a thickness of approximately 100–1000 Angstroms preferably about 400 Angstroms. N-doped poly-crystalline silicon layer 14 has the opposite type of dopant as P-well 11 and forms the gate control layer of an n-FET transistor 60 (shown in FIG. 2F).

Figure 1B:
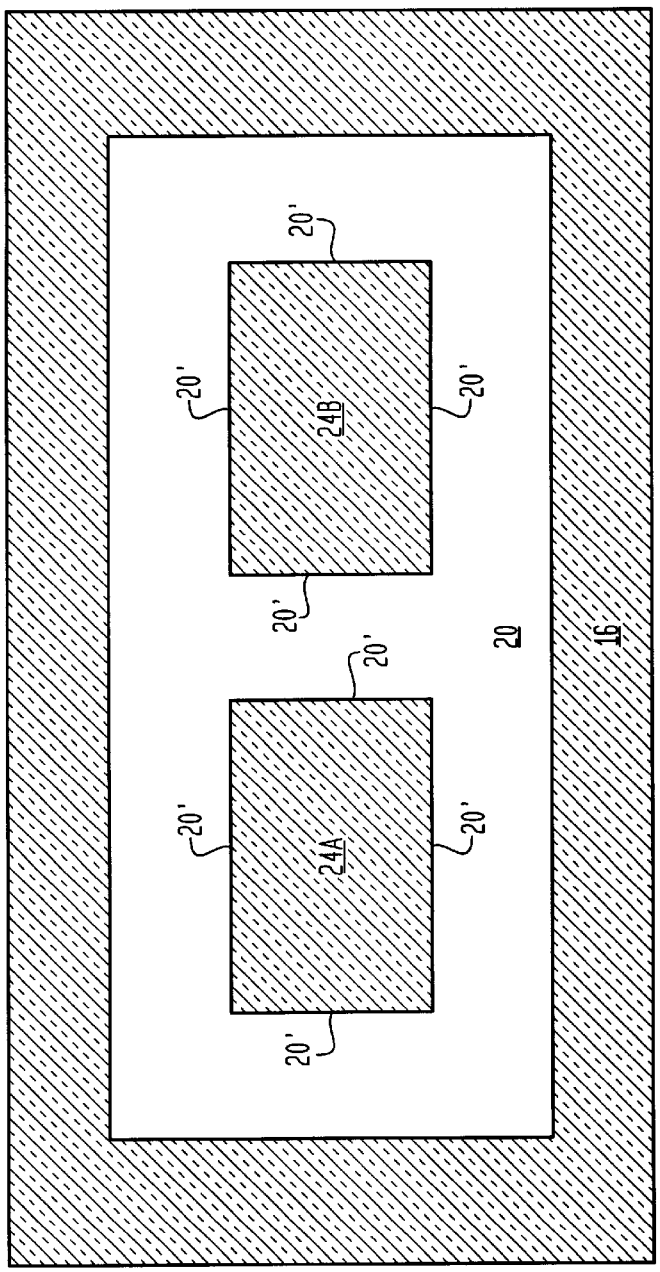
Figure 1B:
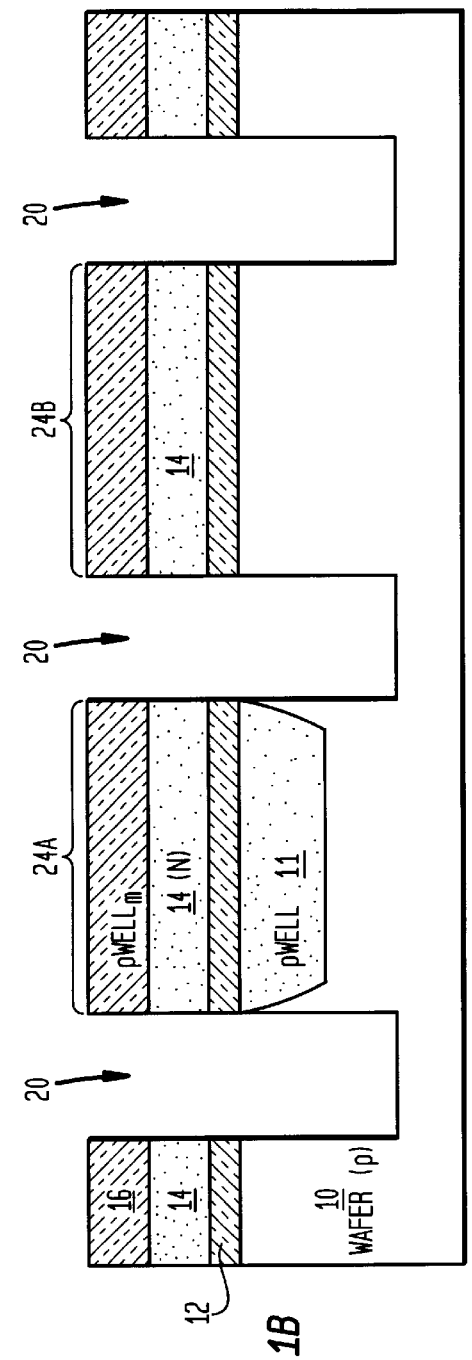

A masking layer 16 is also formed over n-doped poly-crystalline silicon layer 14. Here, masking layer 16 is a dielectric layer, such as a silicon nitride ($Si_3N_4$) layer which is deposited with low pressure chemical vapor deposition and has a thickness of approximately 2,000 Angstroms. Masking layer 16 is etched and patterned, using conventional photolithographic-etching techniques, to open a number of openings 18 for forming active area isolations in the form of so-called shallow trench isolation (STI). The structure in FIG. 1A is subjected to an etching process, such as a reactive ion etch (RIE) process under conditions known in the art. Referring to FIG. 1B, the RIE process etches shallow trenches 20, here approximately 2400 Angstroms deep, in portions of poly-crystalline silicon layer 14, gate oxide 12, and substrate 10 exposed by openings 18.

FIG. 1B' diagrammatically shows a top view of wafer 10 after shallow trenches 20 have been formed. Inner perimeter 20' of shallow trenches 20 delineate active areas 24A, 24B. Inner perimeter 20' of shallow trenches 20 is in this manner in alignment and registration with outer perimeter of active areas 24A, 24B. In other words, inner perimeter 20' of shallow trenches 20 are coextensive with the outer perimeter of active areas 24A, 24B. In active area 24A, an n-FET transistor will be formed and, in active area 24B, a p-FET transistor will be formed, as will be described below. In the case of the n-FET transistor in active area 24A, portions of gate oxide layer 12 and n-doped poly-crystalline silicon layer 14 defined by shallow trenches 20 and coextensive with active area 24A are used to form the gate electrode of the n-FET transistor, as will be described below.

Referring to FIG. 1C, trenches 20 are next passivated by conventional thermal oxidation techniques and filled with field oxide, such as tetraethyl ostho silicate (Teos) or high density plasma oxide (HDP), to form shallow trench isolations (STI) or active area isolations 22. Since active area isolations 22 are formed in trenches 20, inner perimeters of active area isolations 22 are coextensive with active areas 24A, 24B.

Upper surface of active area isolations 22 is located above the surface of the substrate 10. This provides some advantages. For example, during subsequent processing steps (for example, when polishing active area isolations 22) divots may be formed at the surface boundary between active area isolations 22 and the adjacent structures. If the upper surface of active area isolations 22 is not located above the surface of substrate 10, the divots would be partially located in substrate 10. Such divots could result in higher device leakage.

The structure in FIG. 1C is next processed by a chemical mechanical polishing (CMP) process to planarize the upper surface of the structure. Referring to FIG. 1D, another masking layer 26, here silicon nitride ($Si_3N_4$), is deposited over wafer 10. Masking layer 26 is etched and patterned, using conventional photolithographic-etching techniques, to expose the active area 24B via an opening 28 while still covering active area 24A. In this manner, masking layer 26 allows processing active area 24B while protecting transistor 24A. In other embodiments, instead of a silicon nitride mask, a photolithographic mask may be used.

It should be noted that masking layer 26 and active area isolations 22 together form a mask covering the first active area and defining an opening coextensive with the outer perimeter of second active area 24B. In this mask, active area isolations 22 may in part or in whole define the opening coextensive with second active area 24B. Therefore, opening 28 need not necessarily be coextensive with active area 24B but need only cover active area 24A. In other words, opening 28 need not be in exact alignment and registration with the outer perimeter of active area 24A. Therefore, the photolithographic etching of masking layer 26 has a high degree of tolerance to misalignment.

Referring to FIG. 1E, the structure shown in FIG. 1D is next exposed to an etchant which removes silicon nitride layer 16 and n-doped poly-crystalline silicon layer 14 in active area 24B. The etching process may also remove a portion of or the whole gate oxide 12 in active area 24B. The etching process is limited by active area isolations 22 (in combination with masking layer 26 if masking layer 26 extends to the outer perimeter of active area 24B) to active area 24B. In other words, active area isolations 22 and masking layer 26 together function as a mask limiting the etching process to active area 24B. Therefore, the etching process does not affect n-doped poly-crystalline silicon layer 14 or gate oxide layer 12 in active area 24A since they are protected by masking layer 26.

After the above etching process, substrate 10 is subjected to an ion implantation process for implanting substrate 10 with an n-dopant through any remaining portion of gate oxide layer 12 to form an n-well 30. As in the case of the above etching process, during the implantation process, masking layer 26 and, if applicable, active area isolations 22, limit the implantation of n-dopant ions to active area 24B. The structure in FIG. 1F is then heated to activate the implanted dopant ions. Additionally, the structure is wet etched to remove any remaining portion of gate oxide layer 12 in active area 24B. In this case also, masking layer 26 and, if applicable, active area isolations 22 limit the etching process to active area 24B.

Referring to FIG. 1F, a new gate oxide layer 12' is then grown in active area 24B. An p-doped poly-crystalline silicon layer 34 is next deposited over the wafer, filling the area above gate oxide 32. P-doped poly-crystalline silicon layer 34 will be processed to form a gate control layer for an p-FET transistor 62 (shown in FIG. 2F) in active area 24B, as will be described below. Therefore, the described embodiment provides for creation of a gate electrode for p-FET transistor 62 (shown in FIG. 2F) having a poly-crystalline silicon gate control layer which has the opposite type of dopant as its channel region.

Referring to FIG. 1G, the structure in FIG. 1F is then subjected to a chemical mechanical polishing (CMP) process which etches and planarizes the excess poly-crystalline silicon layer down to masking layer 26. The structure is then further exposed to an etchant that removes masking layer 26 and p-doped poly-crystalline silicon layer 34 at the same rate. The etchant here is hot phosphorone (i.e. phosphoric acid $H_3PO_4$). (In other embodiments, a plasma etch, such as chemical downstream etch (CDE), may be used to first remove poly-crystalline silicon layer 34 and next masking layer 26.)

Referring to FIG. 1H, the structure in FIG. 1G is then subjected to etching process which selectively etches silicon nitride but does not significantly, if at all, affect poly-crystalline silicon. Therefore, silicon nitride layer 16 in active area 24A is then etched while p-doped poly-crystalline silicon layer 34 remains substantially intact.

At this point, poly-crystalline silicon layers 14, 34 in two active areas 24A, 24B are reduced to stand at the same level, or below, the upper surface of active area isolations 22. At this point, a portion of p-doped poly-crystalline silicon layer 34 coextensive with active area 24B remains in active area 24B. This portion of p-doped poly-crystalline silicon layer 34 is in essence delineated by active area isolations 22 which delineate active area 24B. As is readily apparent, the above described process does not require any alignment of the delineated portion of p-doped poly-crystalline silicon layer 34 with active area 24. In other words, the process is self-aligned.

In summary, the above described process results in fabricating in each of active areas 24A, 24B a gate oxide layer and a poly-crystalline silicon layer which may be etched and patterned to form gate electrodes of two complementary CMOS transistors. The process provides for poly-crystalline silicon layer 14, 34 being doped by the opposite type of dopant as their corresponding channel regions so as to provide for optimal work function. Additionally, the above process allows using the same mask to form n-doped poly-crystalline silicon layer 34 and n-well 30. In this manner, an efficiency in the number of masks is achieved. Further, the above described process provides for self-alignment of various layers. For example, n-well 30 is self-aligned with active area 24B and active area isolations 22. N-doped poly-crystalline silicon layer 34 is self-aligned with active area 24B and active area isolations 22. Additionally, as will be described below, when n-doped poly-crystalline silicon layer 34 is used to form a gate electrode in active area 24B, n-doped poly-crystalline silicon layer 24 will be self-aligned with the gate electrode.

Referring to FIGS. 2A–2F, a process will now be described for forming transistors in transistor areas 24A, 24B and forming borderless contacts connected to source and/or drain regions of those transistors.

Referring to FIG. 2A, a relatively thin undoped poly-crystalline silicon layer 36, here 100–200 Angstrom thick, is deposited over the structure in FIG. 1H, using a conventional process such as chemical vapor deposition. After planarization, a conductive layer 38, here tungsten silicide (WSi2), is next deposited over undoped poly-crystalline silicon layer 36 using a conventional process such as chemical vapor deposition. Conductive layer 38 is typically used to connect the gate electrode of the transistors to be formed in active areas 24A, 24B to other transistors or devices on substrate 10.

Undoped poly-crystalline silicon layer 36 is deposited before conductive layer 38 to improve the adhesion between conductive layer 38 and the previously formed structures on substrate 10. Dopant molecules from poly-crystalline silicon layers 14, 34 seep into poly-crystalline silicon layer 36 and increase the conductivity of poly-crystalline silicon layer 36. The seepage hence results in a good electrical connection between conductive layer 38 and poly-crystalline silicon layers 14, 34.

Because poly-crystalline silicon layer 36 is not doped, few, if any, impurities from poly-crystalline silicon layer 36 seep into poly-crystalline silicon layers 14, 34. Therefore, poly-crystalline silicon layer 36 does not significantly, if at all, alter the work function of the transistors to be formed in active areas 24A and 24B. Additionally, to reduce the possibility of any cross-contamination of one of layers 14, 34 by dopant molecules from the other one of layers 14, 34, the ratio between the thickness of undoped poly-crystalline silicon layer 36 and the distance between active areas 24A and 24B is such that any contamination of one of the layers 14, 34 by dopant molecules from the other one of layers 14, 34 is kept within a desired range.

After forming conductive layer 38, a dielectric layer 40, here silicon nitride ($Si_3N_4$), is deposited over substrate 10 using a conventional process such as chemical vapor deposition. Referring to FIG. 2B, the structure shown in FIG. 2A is then etched and patterned using conventional techniques to form gate electrodes 42, 44. During the process of forming gate electrodes 42, 44, dielectric layer 40 is etched and patterned at the same time and with the same mask used for the gate electrode to form dielectric caps 40A, 40B over gate electrodes 42, 44. Because dielectric caps 40A, 40B are formed in the same step as the forming of the gate electrodes, the same mask can be used for both. Additionally, because dielectric caps 40A, 40B are formed in the same step and using the same mask as gate electrodes 42, 44, the process of forming dielectric caps 40A, 40B is a self-aligned process.

Figure 2C:
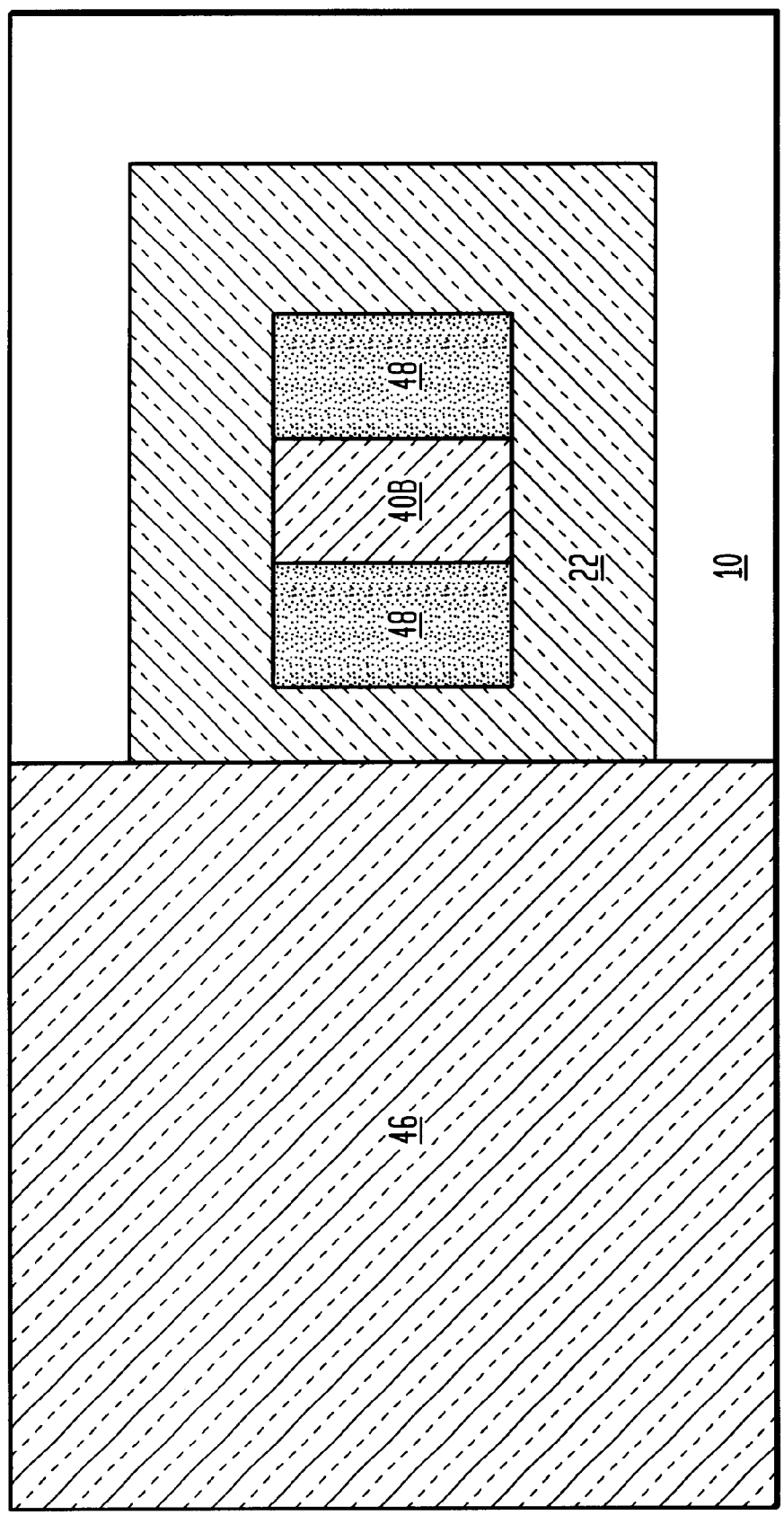

Referring to FIG. 2C, source and drain regions 48 are next formed in active area 24B. To do so, an ion implantation mask 46 is formed over the structure shown in FIG. 2B such that active area 24A is covered and transistor 24B remains exposed. Referring also to FIG. 2C', active area isolations 22 and gate electrode 44 delineate implantation windows 48A, 48B where source and drain regions 48 are formed. Ion implantation mask 46 is not necessarily used for delineating implantation windows 48A, 48B. Ion implantation mask 46 is needed only for covering active area 24A. Therefore, the process used for forming ion implantation mask 26 may be highly misalignment tolerant because it does need to be aligned with previously formed structure in order to delineate implantation windows 48A, 48B.

After forming ion implantation mask 46, the resultant structure is then subjected to an ion implantation process for implanting a suitable p-type dopant to form source and drain regions 48 in active area 24B. After source and drain regions 48 have been formed, ion implantation mask 46 is removed, for example, by using an etchant.

Figure 2D:
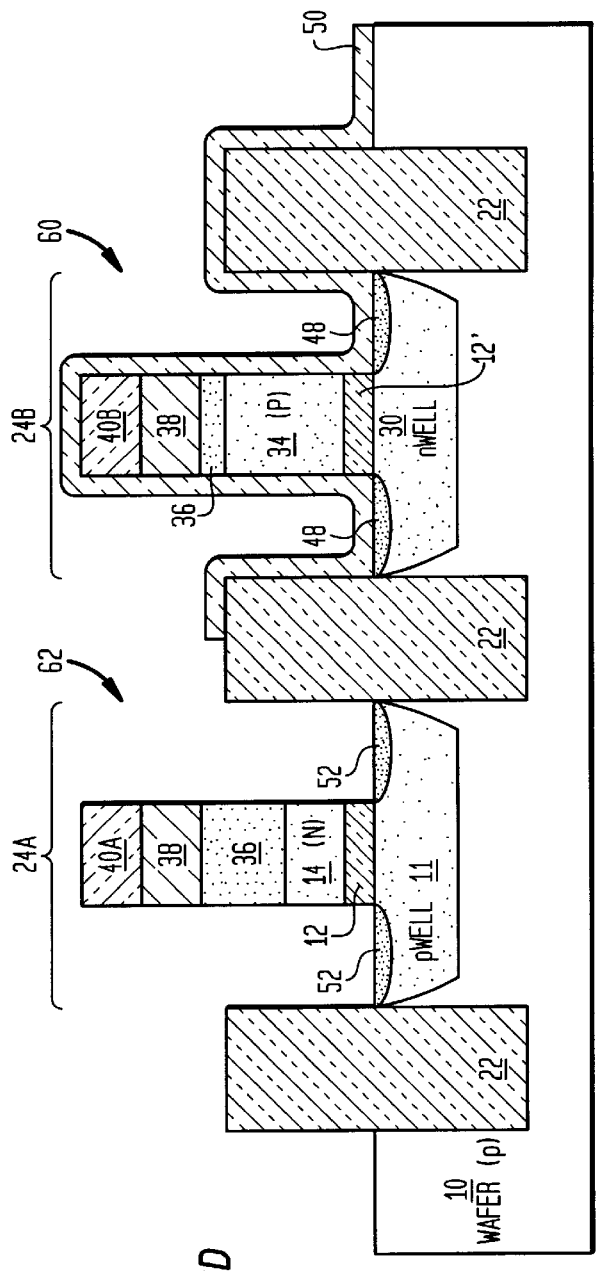

Referring next to FIG. 2D, using a conventional processes, a second ion implantation mask 50 is formed over substrate 10. Second ion implantation mask 50 covers active area 24B. As with ion implantation mask 46, second ion implantation mask 50 is not used to delineate the implantation windows where source and drain regions 52 are formed and is needed only for covering active area 24B. Therefore, the process used for forming second ion implantation mask 50 may be highly tolerant to misalignment.

After forming second ion implantation mask 50, the resultant structure is then subjected to an ion implantation process for implanting a suitable n-type dopant in active area 24A to form source and drain regions 52. After source and drain regions 52 have been formed, ion implantation mask 50 is removed, for example, by using an etchant.

At this point, two transistors 60, 62 have been formed in active areas 24A, 24B, respectively. Gate electrodes 42, 44 of transistors 60, 62 are formed such that they each have a dielectric cap (dielectric caps 40A, 40B, respectively).

Figure 2E:
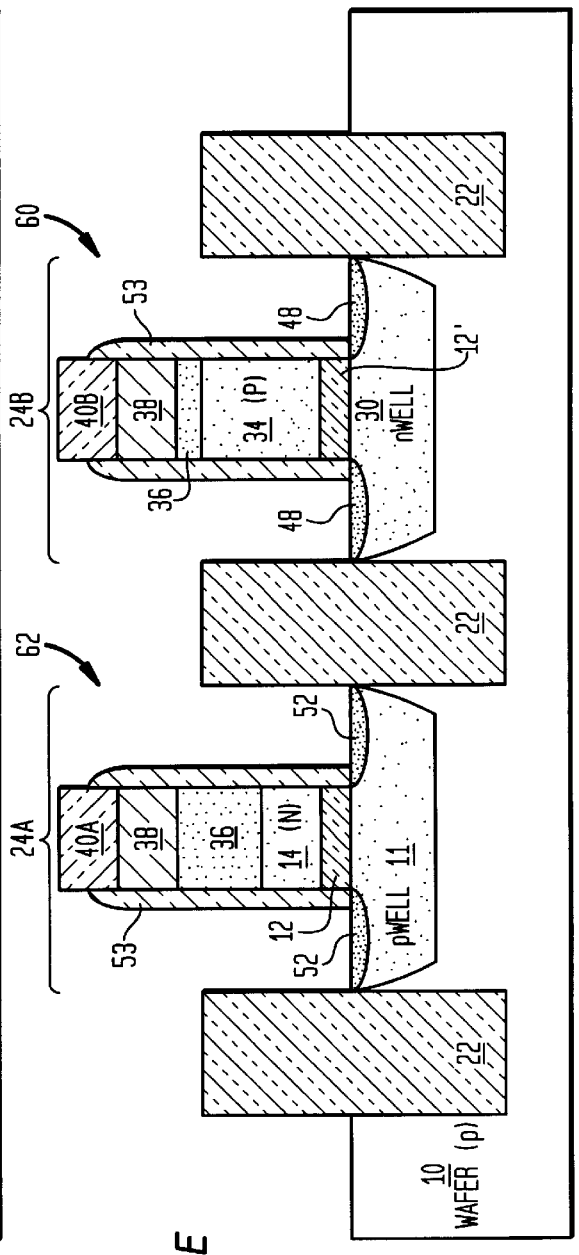

Referring to FIG. 2E, in order to provide for forming borderless contacts, dielectric spacers 53, here silicon nitride (Si3Na) spacers, are then formed adjacent to gate electrodes 42, 44 using conventional techniques. Dielectric spacers 48 extend from dielectric caps 40A, 40B to source and drain regions 48, 52. In combination with dielectric caps 40A, 40B, dielectric spacers 48 cover gate electrodes 42, 44 in dielectric material so as to insulate gate electrodes 42, 44 from any borderless contact to be formed.

Figure 2F:
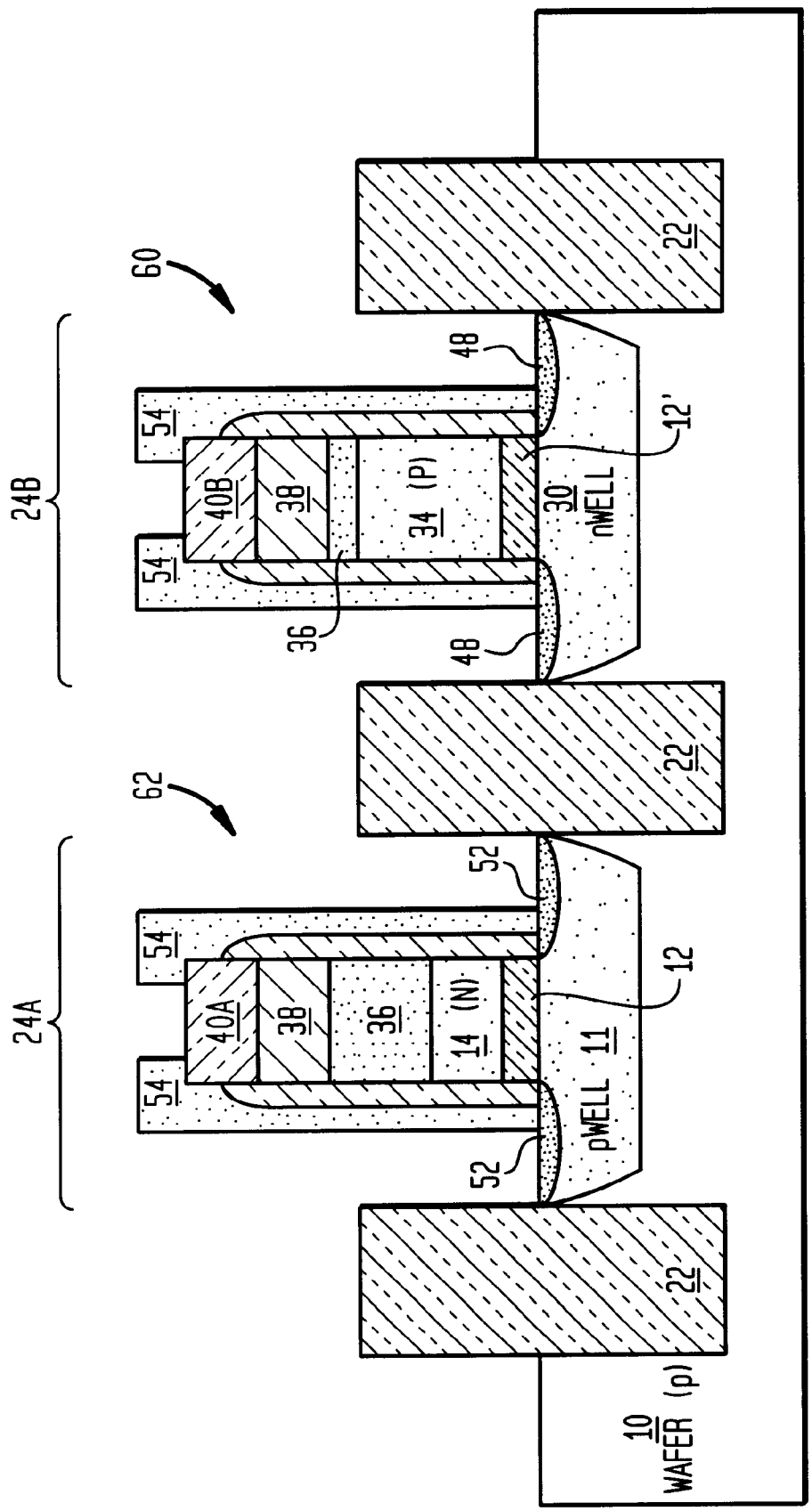

Referring to FIG. 2F, source and drain borderless contacts 54 are next formed using conventional processes. Briefly, to form the contacts, a conductive layer, here a doped polycrystalline silicon layer, is deposited. The conductive layer is then etched and patterned, using conventional photolithographic-etching techniques, to form contacts 54. Because gate electrodes 42, 44 are covered by dielectric caps 40A, 40B and spacers 48, the possibility of contacts 54 short circuiting with gate electrodes 42, 44 as a result of any possible misalignment is reduced significantly. Borderless contacts typically allow a high density of transistors per unit of area.

The process described above uses several self-aligned steps and misalignment tolerant structures. Therefore, the process provides a high yield because the process has a high misalignment tolerance. Additionally, the process described above has the advantage of using less masks than some prior art processes while providing for both dual work function transistors and borderless contacts.

Other embodiments are within the scope of the following claims.

For example, in the above described process, gate oxide layer 12' may be formed to have a different thickness (thicker or thinner) than gate oxide layer 12. In that case, two transistors may be formed with two different gate oxide thicknesses without requiring any additional masks. The two transistor may be both n-type or p-type transistors, or one of the transistors may be an n-type transistor and the other one a p-type transistor.

Figure 3:
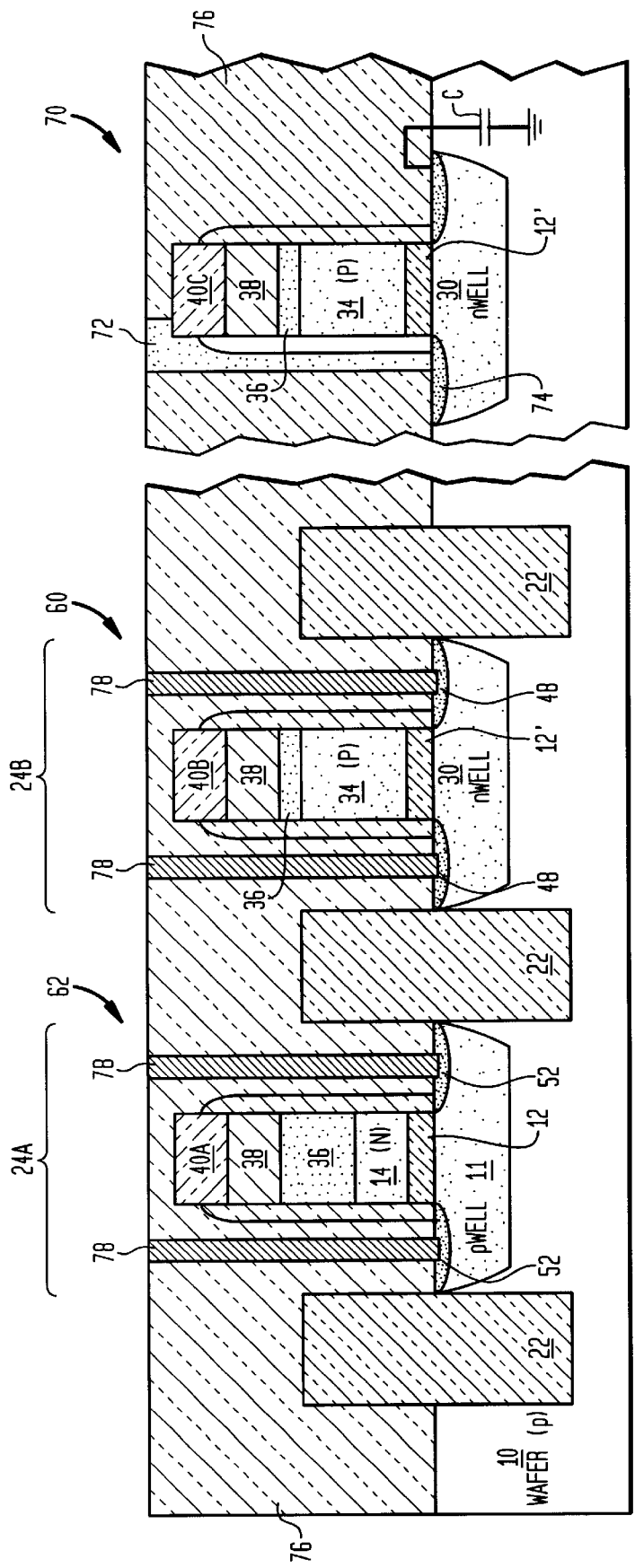
FIG. 3 is a diagrammatical cross-sectional view of a semiconductor device at a stage of an embodiment of the fabrication process of the device according to the invention, where the semiconductor device includes dual work function CMOS transistors and a dynamic random access memory cell having borderless a contact.

In some embodiments, referring to FIG. 3, the process described above with reference to FIGS. 1A–1H and 2A–2F also forms FET transistors of DRAM cells on substrate 10, such as transistor 70. In the structure shown in FIG. 3, however, borderless contacts are not formed for the CMOS transistors 60, 62 (i.e. the process step described in reference to FIG. 2F is not performed with respect to transistors 60, 62). However, a borderless contact 72 for contacting drain region 74 of FET transistor 70 is formed. Note that trench capacitor C connected to source region of FET transistor 70 is formed, using conventional processes, before any of the above structures are formed, that is, before the step of forming p-well 11 in wafer 10.

After forming borderless contact 72, a boron phosphorous silicon glass (BPSG) layer 76 is deposited over the entire structure in substrate. Using conventional photolithographic techniques, a plurality of via holes 78 are etched in BPSG layer 76 for forming contacts. After doping the contact areas in the source/drain regions 48 and 52, slicide layers are formed in source/drain regions 48 and 52 for reducing contact resistance in those regions. Tungsten (W) is then deposited in via holes 78, in any conventional manner, to form the contacts to source/drain regions 48 and 52. The structure then is further processed in any conventional manner to form other layers and structures such as interconnect layers and bond pads.

What is claimed is:

1. A method for fabricating first and second MOSFET transistors in different electrically isolated active areas of a semiconductor body, each one of the transistors having a plurality of layers, comprising:
   forming a first layer over the active areas;
   providing a mask over a first one of the active areas, such mask defining an opening coextensive with a second one of the active areas;
   depositing materials through the opening to form a second layer and a third layer, such second and third layers being coextensive with the second active area;
   forming the first transistor with the first layer as one of the plurality of layers of the first transistor and the second transistor with the second layer and third layer as a pair of the plurality of layers of the second transistor.

2. The method of claim 1 wherein the first layer is formed in both the first and second active areas, the method further comprising removing in whole or in part the first layer from the second active area.

3. The method of claim 1 further comprising forming active area isolations defining the second active area and electrically isolating the second active area, wherein the mask includes the active area isolations and the active area isolations at least in part define the opening.

4. The method of claim 3 further comprising:
   removing selective portions of said masking layer to expose said second active area,
   wherein the masking layer and the active area isolations together form the mask.

5. The method of claim 4 further comprising:
   etching trenches in said first layer and said semiconductor body to delineate the first and second active areas, thereby forming a first delineated layer of material coextensive with the first active area, depositing material in said trenches to form the active area isolations, the active area isolations having a top surface above said semiconductor body.

6. The method of claim 5 further comprising:

depositing another material to form a fourth layer over the mask covering the first active area and in the second active area, and removing portions of the fourth layer to form one of the second and third layers.

7. The method of claim 6 wherein removing portions of the fourth layer includes using a chemical mechanical polishing (CMP) process to etch the fourth layer until the fourth layer is at the same level or below the top surface of the active area isolations.

8. The method of claim 1 including the step of providing the semiconductor body with a first conductivity type of dopant; and forming a doped well in the semiconductor body with one of the materials, said material including a second conductivity type of dopant, the second layer being the doped well.

9. The method of claim 1 wherein the first layer is a first gate oxide layer and the method further comprises forming one of the plurality of layers of the first transistor by depositing a first poly-crystalline silicon layer, wherein the mask covers the first poly-crystalline silicon layer, wherein the second layer is a second gate oxide layer and the third layer is a second poly-crystalline silicon layer, wherein forming the first transistor includes etching and patterning the first gate oxide and the first poly-crystalline silicon layer to form a first gate electrode and wherein forming the second transistor includes etching and patterning the second gate oxide and the second poly-crystalline silicon layer to form a second gate electrode.

10. The method of claim 9 wherein one of said first and second poly-crystalline silicon layers comprises an n-doped poly-crystalline silicon layer and the other one of said first and second poly-crystalline silicon layers comprises a p-doped poly-crystalline silicon layer.

11. The method of claim 9 wherein the first gate oxide layer and the second gate oxide layer have different thicknesses.

12. The method of claim 9 further comprising depositing a dielectric layer over the second poly-crystalline silicon layer, wherein, when etching and patterning the second gate oxide layer and the second poly-crystalline silicon layer to form the second gate electrode, the dielectric layer is etched and patterned to form a dielectric cap over the second poly-crystalline silicon layer in the second gate electrode.

13. The method of claim 12 wherein forming the second transistor further comprises providing a second mask for forming source and drain regions of the second transistor in the semiconductor body and implanting material in the semiconductor body through the second mask to form the source and drain regions of the second transistor, the method further comprising:

forming a dielectric spacer adjacent to a side of the second gate electrode, the dielectric spacer extending from the dielectric cap to one of the source and drain regions adjacent to the side of the second gate electrode, and forming a conductive contact to said one of the source and drain regions, the conductive contact being electrically isolated from the second gate electrode by the dielectric cap and the dielectric spacer.

14. The method of claim 12 further comprising removing at least a portion of the mask covering the first active area prior to depositing the dielectric layer, wherein the dielectric layer is deposited over the first poly-crystalline silicon layer in the first active area and, when etching and patterning the first gate oxide and the first poly-crystalline silicon layer to form the first gate electrode, the dielectric layer is etched and patterned to form a second dielectric cap over the first poly-crystalline silicon layer in the first gate electrode.

15. The method of claim 14 wherein forming the first transistor further comprises providing a third mask for forming source and drain regions of the first transistor in the semiconductor body and implanting material in the semiconductor body through the third mask to form the source and drain regions of the first transistor, the method further comprising:

forming a dielectric spacer adjacent to a side of the first gate electrode, the dielectric spacer extending from the second dielectric cap to one of the source and drain regions of the first transistor being adjacent to the side of the first gate electrode, and forming a conductive contact to said one of the source and draining regions of the first transistor, the conductive contact being isolated from the first gate electrode by the second dielectric cap and the dielectric spacer.

16. A method for fabricating first and second MOSFET transistors in different electrically isolated active areas of a semiconductor body, each one of the transistors having a plurality of layers, comprising:

depositing a first gate oxide layer and a first poly-crystalline silicon layer over the semiconductor body over the active areas;

etching trenches in said first gate oxide and poly-crystalline silicon layers and said semiconductor body to delineate the first and second active areas, thereby forming first delineated gate oxide layer and poly-crystalline silicon layers coextensive with the first active area;

depositing material in said trenches to form the active area isolations, the active area isolations having a top surface above said semiconductor body;

forming a masking layer over said first and second active areas;

removing selective portions of said masking layer to expose said second active area, wherein the masking layer and the active area isolations together form a mask defining an opening coextensive with the second active area and the active area isolations in part or in whole define said opening;

depositing material through the opening to form a second gate oxide layer and a second poly-crystalline silicon layer, such second gate oxide layer and second poly-crystalline silicon layer being coextensive with the second active area;

forming the first transistor with the first delineated gate oxide and poly-crystalline silicon layer as a pair of the plurality of layers of the first transistor and the second transistor with the second gate oxide layer and second poly-crystalline silicon layer as a pair of the plurality of layers of the second transistor.

17. The method of claim 16 further comprising removing in whole or in part the first gate oxide layer from the second active area.

18. The method of claim 16 further comprising:

depositing material to form a fourth layer over the mask and, through the opening, in the second active area, and removing portions of the fourth layer to form one of the second gate oxide layer and second poly-crystalline silicon layer.

19. The method of claim 18 wherein removing portions of the fourth layer includes using a chemical mechanical polishing (CMP) process to etch the fourth layer until the fourth layer is at the same level or below the top surface of the active area isolations.

20. The method of claim 16 wherein the semiconductor body has a first type of dopant and the method further comprises implanting a dopant material of a second type through the opening to form a doped well in the semiconductor body, the doped well having an outer boundary coextensive with the second active area.

21. The method of claim 16 wherein one of said first and second poly-crystalline silicon layers comprises an n-doped poly-crystalline silicon layer and the other one of said first and second poly-crystalline silicon layers comprises a p-doped poly-crystalline silicon layer.

22. The method of claim 16 wherein the first gate oxide layer and the second gate oxide layer have different thicknesses.

23. The method of claim 16 wherein forming the second transistor includes etching and patterning the second gate oxide and the second poly-crystalline silicon layer to form a gate electrode, the gate electrode and the active area isolations defining source and drain areas in the second active area for forming source and drain regions of the second transistor;

forming a second masking layer over said first and second active area;

removing selective portions of said second masking layer to expose said second active area, wherein the masking layer and the active area isolations together form a mask defining a second opening coextensive with the second active area and the active area isolations in part or in whole define the second opening;

implanting dopant material through the second opening in the source and drain areas to form the source and drain regions of the second transistor in the semiconductor body.

24. The method of claim 23 further comprising depositing a dielectric layer over the second poly-crystalline silicon layer, wherein, when etching and patterning the second gate oxide layer and the second poly-crystalline silicon layer to form the second gate electrode, the dielectric layer is etched and patterned to form a dielectric cap over the second poly-crystalline silicon layer in the second gate electrode.

25. The method of claim 24 further comprising:

forming a dielectric spacer adjacent to a side of the second gate electrode, the dielectric spacer extending from the dielectric cap to one of the source and drain regions adjacent to said side of the second gate electrode, and forming a conductive contact to said one of the source and drain regions, the conductive contact being electrically isolated from the second gate electrode by the dielectric cap and the dielectric spacer.

26. The method of claim 25 wherein forming the first transistor includes etching and patterning the first gate oxide and the first poly-crystalline silicon layer to form a second gate electrode, the second gate electrode and the active area isolations defining second source and drain areas in the first active area for forming source and drain regions of the second transistor, the method further comprising:

forming a third masking layer over said first and second active area;

removing selective portions of said second masking layer to expose said first active area, wherein the third masking layer and the active area isolations together form a mask defining a third opening coextensive with the first active area and the active area isolations in whole or in part define the second opening;

implanting dopant material through the third opening in the second source and drain areas to form the second source and drain regions of the first transistor in the semiconductor body.

27. The method of claim 26 further comprising:

removing at least a portion of the third mask covering the first active area prior to depositing the dielectric layer, wherein the dielectric layer is deposited over the first poly-crystalline silicon layer in the first active area, wherein when etching and patterning the first gate oxide and the first poly-crystalline silicon layer to form the first gate electrode, the dielectric layer is etched and patterned to form a second dielectric cap over the first poly-crystalline silicon layer in the first gate electrode.

28. The method of claim 27 further comprising:

forming a second dielectric spacer adjacent to a side of the first gate electrode, the second dielectric spacer extending from the second dielectric cap to one of the second source and drain regions adjacent to said side of the first gate electrode, and forming a second conductive contact to said one of the second source and drain regions, the second conductive contact being electrically isolated from the first gate electrode by the second dielectric cap and the second dielectric spacer.

29. A method for fabricating first and second MOSFET transistors in different electrically isolated active areas of a semiconductor body, each one of the transistors having a plurality of layers, comprising:

forming a first layer over the active areas;

providing a mask over a first one of the active areas, such mask defining an opening coextensive with a second one of the active areas;

depositing material through the opening to form a second layer and a third layer, such second and third layers being coextensive with the second active area;

forming the first transistor with the first layer as one of the plurality of layers of the first transistor and the second transistor with the second layer and third layer as a pair of the plurality of layers of the second transistor;

etching trenches in said first layer and said semiconductor body to delineate the first and second active areas, thereby forming a first delineated layer of material coextensive with the first active area; and depositing material in said trenches to form the active area isolations, the active area isolations having a top surface above said semiconductor body.

30. The method of claim 29 depositing another the material to form a fourth layer over the mask covering the first active area and in the second active area, and removing portions of the fourth layer to form one of the second and third layers.

31. The method of claim 30 wherein removing portions of the fourth layer includes using a chemical mechanical polishing (CMP) process to etch the fourth layer until the fourth layer is at the same level or below the top surface of the active area isolations.

32. A method for fabricating first and second MOSFET transistors in different electrically isolated active areas of a semiconductor body, each one of the transistors having a plurality of layers, comprising:

forming a first layer over the active areas;

providing a mask over a first one of the active areas, such mask defining an opening coextensive with a second one of the active areas;

depositing material through the opening to form a second layer and a third layer, such second and third layers being coextensive with the second active area;

forming the first transistor with the first layer as one of the plurality of layers of the first transistor and the second transistor with the second layer and third layer as a pair of the plurality of layers of the second transistor;

wherein the first layer is a first gate oxide layer and the method further comprises depositing a first poly-crystalline silicon layer, the first poly-crystalline silicon layer being one of the plurality of layers of the first transistor, wherein the mask covers the first poly-crystalline silicon layer, wherein the second layer is a second gate oxide layer and the third layer is a second poly-crystalline silicon layer, wherein forming the first transistor includes etching and patterning the first gate oxide and the first poly-crystalline silicon layer to form a first gate electrode and wherein forming the second transistor includes etching and patterning the second gate oxide and the second poly-crystalline silicon layer to form a second gate electrode.

33. The method of claim 32 wherein one of said first and second poly-crystalline silicon layers comprises an n-doped poly-crystalline silicon layer and the other one of said first and second poly-crystalline silicon layers comprises a p-doped poly-crystalline silicon layer.

34. The method of claim 32 wherein the first gate oxide layer and the second gate oxide layer have different thicknesses.

35. The method of claim 32 further comprising depositing a dielectric layer over the second poly-crystalline silicon layer, wherein, when etching and patterning the second gate oxide layer and the second poly-crystalline silicon layer to form the second gate electrode, the dielectric layer is etched and patterned to form a dielectric cap over the second poly-crystalline silicon layer in the second gate electrode.

36. The method of claim 35 wherein forming the second transistor further comprises providing a second mask for forming source and drain regions of the second transistor in the semiconductor body and implanting material in the semiconductor body through the second mask to form the source and drain regions of the first transistor, the method further comprising:

forming a dielectric spacer adjacent to a side of the second gate electrode, the dielectric spacer extending from the dielectric cap to one of the source and drain regions adjacent to the side of the second gate electrode, and forming a conductive contact to said one of the source and drain regions, the conductive contact being electrically isolated from the second gate electrode by the dielectric cap and the dielectric spacer.

37. The method of claim 35 further comprising removing at least a portion of the mask covering the first area prior to depositing the dielectric layer, wherein the dielectric layer is deposited over the first poly-crystalline silicon layer in the first active area and, when etching and patterning the first gate oxide and the first poly-crystalline silicon layer to form the first gate electrode, the dielectric layer is etched and patterned to form a second dielectric cap over the first poly-crystalline silicon layer in the first gate electrode.

38. The method of claim 36 wherein forming the first transistor further comprises providing a third mask for forming source and drain regions of the first transistor in the semiconductor body and implanting material in the semiconductor body through the third mask to form the source and drain regions of the first transistor, the method further comprising:

forming a dielectric spacer adjacent to a side of the first gate electrode, the dielectric spacer extending from the second dielectric cap to one of the source and drain regions of the first transistor being adjacent to the side of the first gate electrode, and forming a conductive contact to said one of the source and draining regions of the first transistor, the conductive contact being isolated from the first gate electrode by the second dielectric cap and the dielectric spacer.

39. A method for fabricating first and second MOSFET transistors in different electrically isolated active areas of a semiconductor body, each one of the transistors having a plurality of layers, comprising:

depositing a first gate oxide layer and a first poly-crystalline silicon layer over the semiconductor body over the active areas;

etching trenches in said first gate oxide and poly-crystalline silicon layers and said semiconductor body to delineate the first and second active areas, thereby forming first delineated gate oxide layer and poly-crystalline silicon layers coextensive with the first active area;

depositing material in said trenches to form the active area isolations, the active area isolations having a top surface above said semiconductor body;

forming a masking layer over said first and second active areas;

removing selective portions of said masking layer to expose said second active area, wherein the masking layer and the active area isolations together form a mask defining an opening coextensive with the second active area and the active area isolations in part or in whole define said opening;

depositing material through the opening to form a second gate oxide layer and a second poly-crystalline silicon layer, such second gate oxide layer and second poly-crystalline silicon layer being coextensive with the second active area;

forming the first transistor with the first delineated gate oxide and poly-crystalline silicon layer as a pair of the plurality of layers of the first transistor and the second transistor with the second gate oxide layer and second poly-crystalline silicon layer as a pair of the plurality of layers of the second transistor; and removing in whole or in part the first gate oxide layer from the second active area.

40. The method of claim 39 depositing the material to form a fourth layer over the mask and, through the opening, in the second active area;

removing portions of the fourth layer to form one of the second gate oxide layer and second poly-crystalline silicon layer; and wherein removing portions of the fourth layer includes using a chemical mechanical polishing (CMP) process to etch the fourth layer until the fourth layer is at the same level or below the top surface of the active area isolations.

41. A method for fabricating first and second MOSFET transistors in corresponding one of a pair of electrically isolated active areas of a semiconductor body, each one of the transistors having a plurality of layers in the corresponding one of the pair of active areas, comprising:

forming a first layer over the active areas;

providing a mask over a first one of the pair of active areas, such mask defining an opening coextensive with a second one of the pair of active areas;

depositing materials through the opening to form a second layer and a third layer, such second and third layers being coextensive with the second active area; and forming the first transistor with the first layer as one of the plurality of layers in the first one of the pair of active layers and the second transistor with the second layer and third layer as a pair of the plurality of layers of the second transistor.

\* \* \* \* \*